United States Patent [19]

Tanaka et al.

[11] Patent Number: 4,820,562
[45] Date of Patent: Apr. 11, 1989

[54] METALLIZING COMPOSITION FOR SINTERED CERAMIC ARTICLE

[75] Inventors: Shunichiro Tanaka; Akio Sayano, both of Yokohama; Tsuneji Kameda, Yokosuka, all of Japan

[73] Assignee: Kabushiki Kaisha Toshiba, Kanagawa, Japan

[21] Appl. No.: 143,288

[22] Filed: Jan. 7, 1988

Related U.S. Application Data

[62] Division of Ser. No. 905,458, Sep. 10, 1986, abandoned.

[30] Foreign Application Priority Data

Sep. 10, 1985 [JP] Japan ................ 60-200204
Sep. 26, 1985 [JP] Japan ................ 60-211053

[51] Int. Cl.$^4$ ............................ F16L 5/02; B05B 7/00
[52] U.S. Cl. .................................... 428/34.6; 428/627; 428/628; 428/629; 252/512; 252/518; 252/520; 106/1.05; 106/1.12; 106/1.22; 427/383.5; 427/383.7; 427/383.9; 427/380; 427/126.2; 427/123
[58] Field of Search ............ 106/1.12, 1.22, 1.05; 428/36, 35, 210, 627–629, 651; 252/516, 512, 518, 520; 419/5, 8, 53, 57, 58, 65; 427/126.1, 379, 126.2, 380, 123, 383.5, 383.7, 383.9

[56] References Cited

U.S. PATENT DOCUMENTS 4,381,198  4/1983  Kondo et al. .................. 106/1.12
4,493,789  1/1985  Ueyama et al. ................ 252/518

FOREIGN PATENT DOCUMENTS 3247985   5/1984  Fed. Rep. of Germany .
59-217680  7/1984  Japan .
60-77185   1/1985  Japan .

Primary Examiner—Josephine Barr
Attorney, Agent, or Firm—Finnegan, Henderson, Farabow, Garrett, & Dunner

[57] ABSTRACT

This invention relates to a metallizing composition capable of forming an electroconductive coating of satisfactory adherence properties on the surface of a sintered ceramic article, particularly on a sintered silicon nitride type ceramic article. The metallizing composition contains metal salts of tungstic acid and/or molybdic acid and a metal of Group IVb of the Periodic Table of Elements or a compound thereof. The electroconductive coating of high adherence properties is formed by applying the metallizing composition on a sintered ceramic article and drying the deposited layer of the composition in air, heating the dried layer, and firing the layer in a non-oxidizing atmosphere. The metallizing composition is suitable for the formation of the electroconductive coating on a complexly shaped sintered ceramic article such as, for example, on the inner surface of a hollow ceramic article.

3 Claims, 1 Drawing Sheet

METALLIZING COMPOSITION FOR SINTERED CERAMIC ARTICLE

This application is a division, of application Ser. No. 905,458, filed Sept. 10, 1986 abandoned.

The present application claims priority of Japanese Patent Application No. 60-200204 filed on Sept. 10, 1985 and No. 60-211053 filed on Sept. 26, 1985.

FIELD OF THE INVENTION AND RELATED ART STATEMENT

This invention relates to a metallizing composition which is capable of forming an electroconductive coating on a sintered ceramic article, particularly on a sintered nitride type ceramic article which has been long held as permitting no easy metallization.

Heretofore, the purpose of effecting adhesion of a metal member to a sintered cramic article, the practice of forming an electroconductive coating on the surface of the sintered ceramic article has been in vogue.

As means of forming the electroconductive coating, the method which comprises applying on the surface of a sintered ceramic article a molybdenum-manganese metallizing paste composed mainly of molybdenum powder and manganese powder and firing the applied layer of the metallizing paste in a reducing atmosphere has found popular acceptance.

This method has been invariably applied successfully to sintered ceramic articles based on alumina and other similar oxides. For application to such sintered ceramic articles as based on silicon nitride and other similar non-oxide compounds which are attracting growing public attention in recent years, however, this method has much to be desired. It has been found that since this methods forms an electroconductive coating with difficulty, for example, it is not always applicable advantageously to sintered non-oxide type ceramic articles.

For the purpose of obtaining a sintered silicon nitride article provided with an electroconductive coating, the method which comprises preparing a porous sintered silicon nitride ceramic article by the reactive sintering method, for example, infiltrating the surface region of the sintered ceramic article with ammonium molybdate, and reducing the infiltrated surface region thereby giving rise to an electroconductive coating formed of molybdenum has been tried.

This method is effective in bonding two sintered ceramic articles to each other because the electroconductive coating is formed of molybdenum which possesses a thermal expansion coefficient substantially equal to that of the silicon nitride ceramic. The bonding strength attained by this method has its limit, because the molybdenum in the electroconductive coating has not undergone any chemical reaction with the silicon nitride ceramic. Further, this method has the disadvantage that it permits the bonding between a sintered non-oxide type ceramic article and a metal member, particularly a steel member, only with difficulty.

OBJECT AND SUMMARY OF THE INVENTION

This invention has been produced to eliminate the various drawbacks suffered heretofore as described above. It aims to provide a metallizing composition capable of forming on a sintered ceramic article an electroconductive coating which tightly bonds fast to the sintered ceramic substrate and permits join of the sintered ceramic article with a metal member.

To be specific, the metallizing composition of the present invention is characterized by containing metal salts of tungstic acid and/or molybdic acid and a transition metal of the Group IVb of the Peridic Table of Elements or a compound thereof.

DETAILED DESCRIPTION OF PREFERRED EMBODIMENTS

Figure 1:
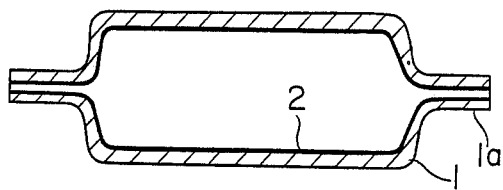
FIG. 1 and FIG. 2 are cross sections of preferred embodiments of this invention.

The sintered ceramic articles to which this invention is applied are desired to be non-oxide type ceramics because of their excellence in strength, for example. Among other non-oxide type ceramics, those ceramics which contain nitrogen as one of the component elements thereof such as, for example, silicon nitride type ceramics represented by silicon nitride and Si—Al—O—N, aluminum nitride type ceramics, and boron nitride type ceramics are particularly desirable.

This invention can also be applied to alumina type, beryllia type, and other similar type ceramics which form known ceramic substrates and to carbides such as silicon carbide.

As examples of the metal salt of tungstic acid to be used for this invention, lithium tungstate, potassium tungstate, calcium tungstate, sodium tungstate, and magnesium tungstate can be cited. As examples of the metal salt of molybdic acid to be used for this invention, lithium molybdate, potassium molybdate, potassium molybdate, calcium molybdate, sodium molybdate, and lead molybdate can be cited.

As examples of the transition metal of the Group IVb of the Periodic Table of Elements and the compound thereof to be used for the present invention, titanium, zirconium, hafnium, and oxides, borides, carbides, and organic metal compounds thereof can be cited. Among those transition metals and compounds thereof, titanium dioxide proves particularly desirable.

The metallizing composition of the present invention is suitably used in the form of a liquid or paste which has the aforementioned metal salt and the transition metal of Group IVb or the compound thereof carried in a binder such as ethyl cellulose, for example, or in water. Preferably, the total amount of the metal salts of tungstic acid and/or molybdic acid and the transition metal of Group IVb or the compound thereof in the composition is not less than 50 mol% and the gravimetric ratio of the metal salt to the transition metal of Group IVb or the compound thereof is in the range of 1:6 to 3:1, and the contents of the two components are each not less than 2 mol%.

In this invention, the electroconductive coating is formed by applying the metallizing composition to the stated part of the sintered ceramic article or by infiltrating the stated part with the metallizing composition, drying the deposited metallizing composition thereby removing the solvent therefrom, then heating the dried layer of the metallizing composition in the air at a temperature exceeding the level at which the metal salt of tungstic acid or molybdic acid is fused, and subsequently firing the layer in a non-oxidizing atmosphere at a temperature exceeding 1,100° C. The heating made in the air at the temperature exceeding the level at which the metal salt is fused is intended for enhancing the fast adhesion of the composition to the sintered ceramic article and improving the wetting property of the composition.

The firing made in the non-oxidizing atmosphere is intended for causing a reaction of the sintered ceramic article with the metal salt of tungstic acid or molybdic acid and further causing a reaction of the nitrogen in the sintered ceramic article with the transition metal of Group IVb thereby giving rise to an electroconductive such as titanium nitride. The firing temperature necessary for this treatment varies with the components of the metallizing composition. In the case of a metallizing composition containing lithium molybdate and titanium dioxide, for example, the firing is desired to be carried out at a temperature in the range of 1,200° to 1,400° C.

The metallizing composition of the present invention can be endowed with desired flowability. It is, therefore, suitable for the formation of through holes in ceramic substrates, solid conduits piercing ceramic substrates, and inner surfaces of ceramic pipes and complexly shaped hollow ceramic articles such as, for example, conduits for introducing a target positive electrode current into rotary articles for magnetic flotation type X-ray tubes which have heretofore resorted inevitably to the electroless plating technique.

Now, the present invention will be described below with reference to working examples.

EXAMPLE 1

An inky metallizing composition was prepared by adding a suitable amount of a binder to 2 g of a mixed powder consisting of lithium molybdate ($Li_2MoO_4$) and titanium dioxide ($TiO_2$) in a gravimetric ratio of 1:1. This paste was applied on the surface of a sintered ceramic article made of aluminum nitride for use as a semiconductor substrate. The applied layer of the paste was dried, then heated in the air at 750° C. for 5 minutes to melt lithium molybdate, and subsequently fired in a 1:1 mixed gas of nitrogen and hydrogen at 1,300° C. for 60 minutes to form an electroconductive coating. This electroconductive coating was found to consist of TiN, Mo, and a spinel phase resembling $\gamma$-$Al_2O_3$.

On the sintered ceramic article thus vested with the electroconductive coating, nickel was deposited in a thickness of 3 to 4 $\mu$m by the electroplating technique. The resulting nickel-plated sintered ceramic article was bonded to a similarly nickel-plated piece of Kovar alloy through the medium of silver-copper solder. The bonded article, by shear test, was found to possess bonding strength of about 9 kg/mm.

EXAMPLE 2

A metallizing composition slurry was prepared by adding 6 g of water to 2 g of a mixed powder consisting of lithium molybdate and titanium dioxide in a gravimetric ratio of 1:1. This slurry was applied on the surface of a ceramic substrate made of silicon nitride containing yttrium oxide and aluminum oxide. The deposited layer of the slurry was dried, then heated in the air at 750° C. for 5 minutes to fuse lithium molybdate, and subsequently fired in a mixed gas consisting of nitrogen and hydrogen in a ratio of 1:1 at 1,300° C. for 60 minutes to give rise to an electroconductive coating. This electroconductive coating was found to consist of TiN, Mo, $Y_2O_3$ $2SiO_2$, and a small amount of an unknown phase. The electroconductive coating, with nickel further deposited thereon by the electroplating technique, was bonded to a steel material by silver-copper soldering with a copper piece 0.3 mm in thickness interposed therebetween as a buffer.

EXAMPLE 3

In a hollow tube 1 of alumina having an outside diameter of 50 mm and provided at the opposite ends thereof with a radially reduced part 10 mm in outside diameter as illustrated in FIG. 1, the inky metallizing composition used in Example 1 was placed and caused to be deposited uniformly on the inner surface of the tube. The deposited layer of the paste was dried and then fired in a reducing atmosphere consisting of nitrogen and hydrogen at 1,350° C. for 2 hours, to give rise to an electroconductive surface 2 about 10 $\mu$m in thickness on the inner surface of the tube.

EXAMPLE 4

Figure 2:
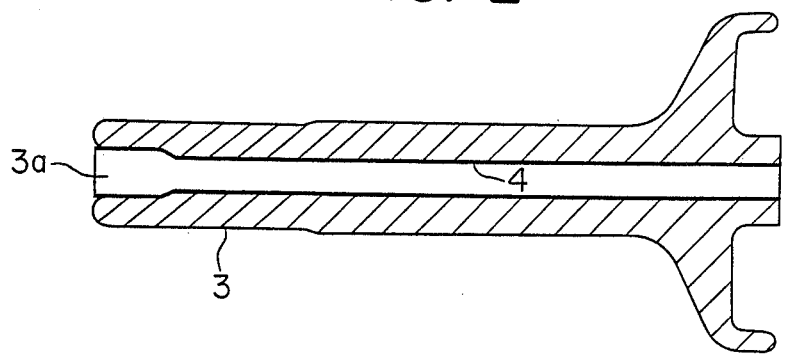

The metallizing composition slurry used in Example 2 was passed in through hole 3 perforated centrally in a rotary article 3 as illustrated in FIG. 2 and was deposited on the inner surface of the hollow rotary article 3. The deposited layer of the slurry was dried and then fired at about 1,300° C. for 2 hours, to give to an electroconductive hollow hole 4 inside the rotary article.

EXAMPLE 5

Figure 3:
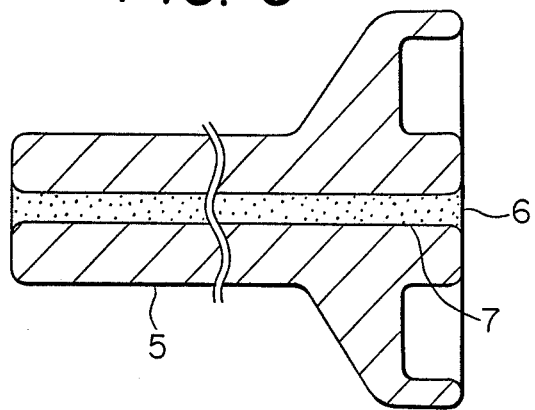
FIG. 3 is a cross section illustrating a rotary ceramic article for use in a magnetic flotation type X-ray tube as one preferred embodiment of this invention.

A rotary article for use in a magnetic flotation type X-ray tube was molded of silicon nitride powder containing 5% by weight of yttrium oxide, 4% by weight of alumina, and 3% by weight of aluminium nitride as sintering aids and a binder in a prescribed shape having a through hole perforated in a rotary shaft by the conventional method as illustrated in FIG. 3. The rotary article was fired in an atmosphere of nitrogen at about 1,750° C. for 2 hours. The rotary ceramic article 5 was placed upright. A metallizing composition consisting of lithium molybdate, titanium dioxide, and butyl acetate (in a gravimetric ratio of 1:1:7) was passed in the central through hole 6 and deposited on the inner surface of the through hole. The deposited layer of the composition was heated in the air at 750° C. for 5 minutes to fuse lithium molybdate and then fired in a 1:1 mixed gas of nitrogen and hydrogen at 1,300° C. for 60 minutes, to give rise to an electroconductive conduit 7.

The electroconductive hollow hole thus formed exhibited fast bonding to the ceramic and permitted easy balancing of the X-ray tube. The electroconductive hollow hole, on analysis, was found to be formed of a substance consisting mainly of titanium nitride and molybdenum.

As described above, the composition of the present invention enables formation of an electroconductive coating having extremely high bonding strength even with a sintered nitride type ceramic article which is not easily metallized. Thus, it provides fast bonding not merely between two sintered ceramic articles but also between a sintered ceramic article and a metal member.

Further, since the metallizing composition possesses fluidity, it can form an electroconductive coating even on a part such as the inner surface of a hollow article on which an electroconductive layer cannot be easily formed by any of the conventional means.

What is claimed is:

1. A rotary sintered ceramic article having an electroconductive surface layer within a hole formed along an axis of rotation of and within said article, said electroconductive surface layer consisting essentially of a sintered ceramic including at least one nitride-forming element selected from Group IVb of the Periodic Table and at least one element selected from the group consisting of tungsten and molybdenum, said article being produced by a method comprising applying a metallizing composition onto a surface of said hole onto which said electroconductive surface layer is to be formed, said metallizing composition comprising at least one metal salt selected from the group consisting of tungstic acid and molybdic acid, at least one metal compound selected from the group consisting of an oxide, boride, carbide and organic compound of a metal selected from Group IVb of the Periodic Table and a binder, drying said metallizing composition, heating said metallizing composition to fuse said at least one metal salt and firing said metallizing composition in a nonoxidizing atmosphere to react said sintered ceramic with said at least one metal compound to result in said electroconductive surface layer.

2. The article of claim 1 wherein said sintered ceramic is selected from the group consisting of sintered silicon nitride and sintered aluminum nitride.

3. The article of claim 1 wherein said at least one metal salt is lithium tungstate and said at least one metal compound is titanium dioxide.

* * * * *